United States Patent
Srinivasan et al.

[11] Patent Number: 6,040,010
[45] Date of Patent: *Mar. 21, 2000

[54] CATALYTIC BREAKDOWN OF REACTANT GASES IN CHEMICAL VAPOR DEPOSITION

[75] Inventors: Anand Srinivasan; Gurtej S. Sandhu, both of Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/709,856

[22] Filed: Sep. 10, 1996

[51] Int. Cl.$^7$ .............................. C23C 16/06; C23C 16/08
[52] U.S. Cl. ................... 427/250; 427/253; 427/255.11; 427/255.28; 427/255.39
[58] Field of Search ..................... 427/252, 250, 427/255.1, 255.2, 255.3, 255, 253, 255.11, 255.28, 255.39

[56] References Cited

U.S. PATENT DOCUMENTS

| | | | |
|---|---|---|---|
| 4,794,019 | 12/1988 | Miller . | |
| 4,830,890 | 5/1989 | Kanai | 427/255 |
| 4,870,030 | 9/1989 | Markunas et al. . | |
| 5,018,479 | 5/1991 | Markunas et al. . | |
| 5,173,327 | 12/1992 | Sandhu et al. . | |
| 5,403,620 | 4/1995 | Kaesz et al. | 427/255.2 |
| 5,480,684 | 1/1996 | Sandhu | 427/255 |

OTHER PUBLICATIONS

George, Joy, Preparation of Thin Films; Marcel Dekker, Inc, 1992, pp. 226–227.
Matsumura, "Low Temperature Deposition of Silicon Nitride by the Catalytic Chemical Vapor Deposition Method" (Matsumura I), Jap. J. Appl. Phys. 28 (10), 1989.
Matsumura, "Study on catalytic chemical vapor deposition method to prepare hydrogenated amorphous silicon" (Matsumura II), J. Appl. Phys. 65 (11), 1989.
Matsumura, "Catalytic Chemical Vapor Deposition (CTL–CVD) Method Producing High Quality Hydrogenated Amorphous Silicon", Jap. J. Appl. Phys. 25(12), 1986.
Matsumura, "Silicon nitride produced by catalytic chemical vapor deposition method", J. Appl. Phys. 66(8), 1989.

*Primary Examiner*—Sheine Beek
*Assistant Examiner*—Bret Chen
*Attorney, Agent, or Firm*—Mueting, Raasch & Gebhardt, P.A.

[57] ABSTRACT

Methods and apparatus for depositing films on semiconductor wafers in chemical vapor deposition processes employing a catalyst to provide one or more activated gases to reduce the surface temperature of the semiconductor wafer needed to form the film thereon. The activated gas precursors can include hydrogen or hydrogen-bearing gases. The catalysts can be selected from ruthenium, rhodium, palladium, osmium, iridium, platinum, gold, silver, mercury, rhenium, copper, tungsten, and combinations thereof.

16 Claims, 4 Drawing Sheets

CATALYTIC BREAKDOWN OF REACTANT GASES IN CHEMICAL VAPOR DEPOSITION

FIELD OF THE INVENTION

The present invention relates to the field of films formed using chemical vapor deposition. More particularly, the present invention relates to the catalytic breakdown of reactant gases in chemical vapor deposition of films on semiconductor wafers.

BACKGROUND OF THE INVENTION

Chemical vapor deposition (CVD) is a commonly used means for depositing films on a substrate, such as a semiconductor wafer. Typically, CVD processes rely, at least in part, on thermal energy of the semiconductor to initiate the desired reactions. In some instances, however, it is desirable to reduce or minimize the temperature of a semiconductor wafer to protect the structures and materials that are already present.

One example of a material that can be damaged by excessive heat is a film of aluminum. If excessive heat is used after a layer of aluminum is already in place on a semiconductor wafer, the aluminum may diffuse into the adjoining materials, including the substrate itself. That diffusion can adversely affect the electrical performance of the aluminum and the adjoining layers, potentially leading to a defective semiconductor chip.

One approach at reducing the temperature, or thermal budget, necessary for high quality film deposition on semiconductor wafers is the use of plasma-enhanced CVD (PECVD). In that process, the inlet gases are excited by a radio frequency field that produces a plasma region containing free electrons, normal neutral gas molecules, ionized gas molecules, ionized portions of broken-up gas molecules, and free radicals. Although the additional energy imparted in PECVD processes does assist in the formation of thin films on the semiconductor substrates at lower temperatures, the PECVD processes do require the additional expense associated with purchasing and operating the plasma generating equipment. Furthermore, existing CVD equipment must often be extensively modified to accommodate the plasma generation or new equipment designed for PECVD must be purchased.

Another disadvantage of PECVD processes is that the additional energy present in the plasma region can result in ion implantation, energetic neutral embedment, sputtering and associated damage to the semiconductor wafer. In an attempt to address the problems caused by the additional energy in the plasma region, Markunas et al. described a process and equipment for remote plasma enhanced CVD (RPECVD) in which the plasma region is located away from the substrate as described in U.S. Pat. No. 4,870,030. That process still relies, however, on plasma generation to reduce the thermal energy required for CVD. As a result, the additional costs associated with purchasing and operating plasma generating equipment still remain. Furthermore, the CVD chambers must be extensively modified to provide for remote plasma generation.

As a result, a need exists for a CVD process with a low thermal budget that can be used chemical vapor deposition of films on thermally-sensitive semiconductor wafers.

SUMMARY OF THE INVENTION

The present invention provides a method of depositing a film on a semiconductor wafer in a chemical vapor deposition process by contacting one or more activated gas precursors with one or more catalysts to produce one or more activated gases, and contacting the semiconductor wafer with the activated gases, wherein a film is formed on the semiconductor.

The catalysts may be heated to improve the production of activated gases using the activated gas precursors. One range of preferred catalyst temperatures is from about 300° C. to about 1200° C., more preferably about 500° C. to about 600° C.

The catalysts may be selected from the group consisting of ruthenium, rhodium, palladium, osmium, iridium, platinum, gold, silver, mercury, rhenium, copper, tungsten, and combinations thereof.

The activated gas precursors are preferably hydrogen-bearing gases, for example, $H_2$, HCl, $SiH_4$, etc.

By using an activated gas, the temperature of the semiconductor may be held to a temperature of about 600° C. or less, more preferably about 450° C. or less, and even more preferably about 300° C. or less.

The present invention also provides an apparatus for depositing films on semiconductor wafers using chemical vapor deposition, the apparatus including a source of activated gas precursor in communication with the reaction chamber via a gas inlet, catalytic material located between the activated gas precursor source and the gas inlet, the catalytic material being in contact with the activated gas precursor as it moves from the activated gas precursor source to the reaction chamber.

The apparatus may also include a means for heating the catalyst to improve the production of activated gas. The means for heating may heat the catalytic material to temperatures from about 300° C. to about 1200° C., more preferably about 500° C. to about 600° C.

The catalyst may be selected from the group consisting of ruthenium, rhodium, palladium, osmium, iridium, platinum, gold, silver, mercury, rhenium, copper, tungsten, and combinations thereof.

The activated gas precursor is preferably a hydrogen-bearing gas, for example, $H_2$, HCl, $SiH_4$, etc.

By using an activated gas, the apparatus may need to heat a semiconductor to a temperature of about 600° C. or less, more preferably about 450° C. or less, and even more preferably about 300° C. or less.

These and other features and advantages of the present invention are described in more detail below.

DETAILED DESCRIPTION OF THE INVENTION

The present invention is directed to a method and apparatus for chemical vapor deposition of thin metallic films in a semiconductor fabrication process, such as a process for manufacturing a memory semiconductor device. One example of such a device is a dynamic random access memory device.

Figure 1:
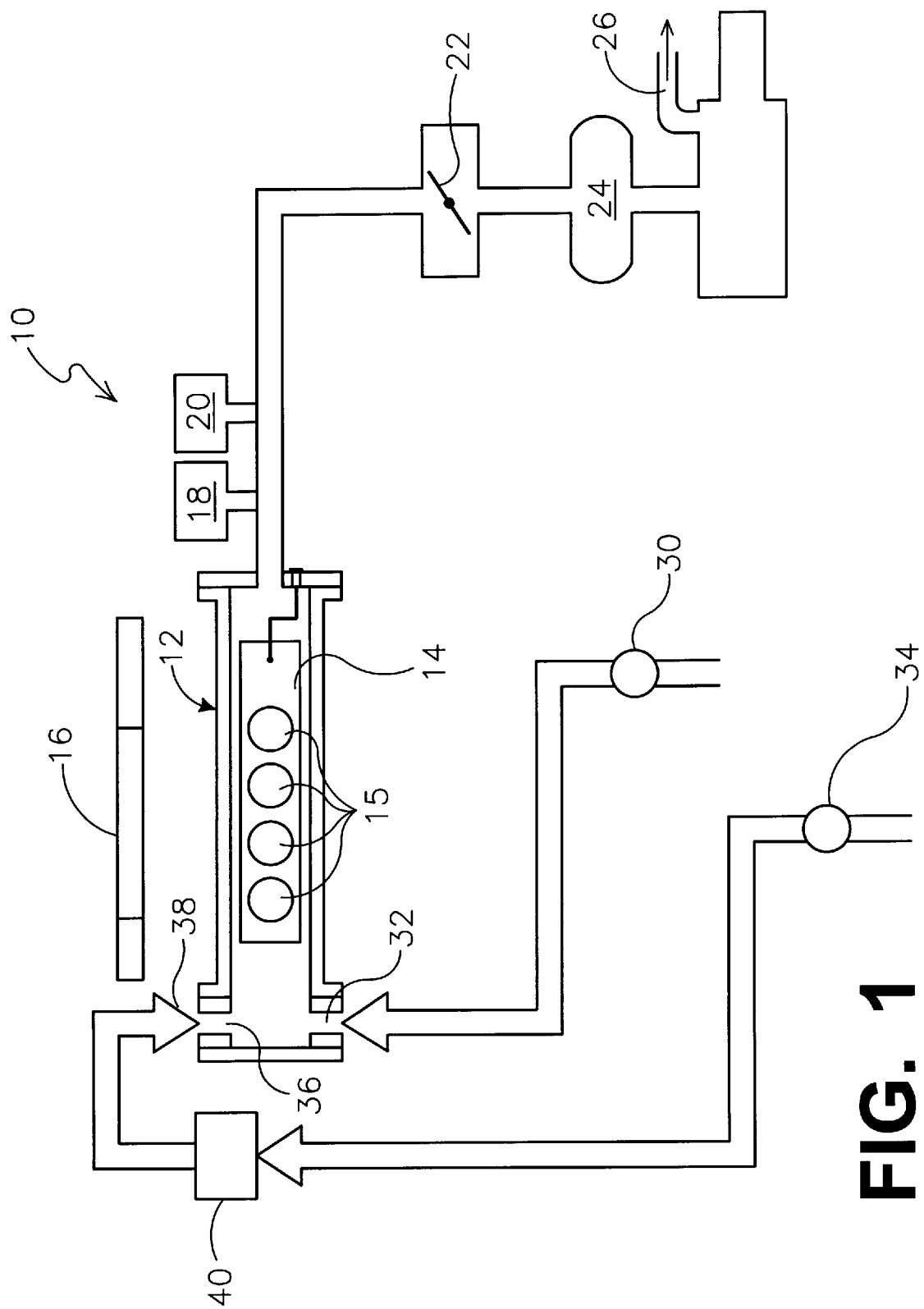
FIG. 1 is a schematic diagram of one chemical vapor deposition apparatus according to the present invention.

FIG. 1 is a schematic depiction of one CVD reactor 10 according to the present invention. It will be understood that the present invention can be adapted to either atmospheric or low pressure chemical vapor deposition processes and, in either case, to hot wall or cold wall processes within either of those groups. For the purposes of illustration, FIG. 1 depicts the necessary components for a low pressure CVD process. In any process, at least the wafer boat 14 and attached semiconductor wafers 15 are maintained at a desired temperature by a temperature controller 16, typically a heat source. The desired deposition pressure is set and controlled by a pressure sensor 18, pressure switch 20, and pressure control valve 22. Gas is flowed through the system using a blower 24 and vented to an appropriate exhaust/scrubber system 26.

The reactor chamber 12 is flooded with a source gas 30 (also referred to as a first gas) through an inlet 32 and an activated gas precursor 34 is input into the chamber 12 through an inlet 36. The activated gas precursor 34 flows past or over a catalyst 40 to produce the activated gas 38 introduced into the chamber 12 through inlet 36. Once in the chamber 12, the source gas 30 and the activated gas 38 are adsorbed on the wafers 15 where they react to form the desired film and the gaseous reactant products are desorbed and carried away in the gas stream flowing towards blower 24.

The catalyst 40 can be located anywhere in the path of the activated gas precursor 34 upstream of the wafers 15. As the activated gas precursor 34 flows past the catalyst 40 an activated gas 38 is produced to foster the reactions at the surfaces of the semiconductor wafers 15 to form the desired films on those wafers. The production of activated gas 40 may involve adsorption of the activated gas precursor 34 and desorption of the activated gas 38. Other mechanisms involved in production of the activated gas 40 could include absorption/desorption, etc.

Examples of useful materials for the catalyst 40 include ruthenium, rhodium, palladium, osmium, iridium, platinum, gold, silver, mercury, rhenium, copper, tungsten and combinations of two or more of the above.

The catalyst 40 can be heated to improve the production of activated gas 38 from the activated gas precursor 34. The means for heating the catalyst 40 could include resistance heating, radio frequency heating, ultrasonic energy, or any other source that can provide the thermal energy necessary to heat the catalyst 40 to the desired temperatures. If heated, the temperatures of the catalyst will be dependent on the surface area of the catalyst 40, flow rate of the activated gas precursor 34, and temperature of the activated gas precursor 34—all of which can affect the rate of catalytic breakdown of the activated gas precursor 34 by the catalyst 40, and, thus, the amount or quality of the activated gas 38 introduced into the chamber 12. Typically, however, the preferred temperature to which the catalyst 40 is heated lies within a range from about 300° C. to about 1200° C. More preferably, the catalyst 40 is heated to a temperature lying between about 500° C. to about 600° C.

The catalyst 40 can be provided anywhere along the flow path of the activated gas precursor 34, although it is preferably located as close to the reactor chamber 12 as possible to supply as much activated gas 38 as possible to the reactor chamber 12. In some instances, the catalyst 40 may simply be plated onto the interior of a pipe used to supply the activated gas precursor 34. In other cases, the catalyst 40 may be located in the "showerhead" used to distribute gases in some CVD reactors. It may also be helpful to increase the surface area of the catalyst 40 by providing the catalyst 40 on a mesh, ceramic monolith or other structure that increases the surface area of the catalyst 40 in the flow path of the activated gas precursor 34.

It is preferred that the catalyst 40 be located outside of the flow path of the source gas 30 to prevent reactions between the source gas 30 and activated gas precursor 34 at or near the surface of the catalyst 40. It is also preferred to minimize the distance between the inlet 36 and the surfaces of the semiconductor wafers 15 to reduce gas phase reactions between the activated gas 38 and the source gas 30 within the chamber 12.

The activated gas precursor 34 preferably comprises hydrogen, including elemental hydrogen or hydrogen-bearing gases. The exact choice of the activated gas precursor 34 will be dependent on the film to be deposited on the semiconductor wafers 15, i.e., the activated gas 38 and its precursor preferably will not contain any materials that will degrade the quality of the film to be deposited on the semiconductor wafers 15. If polycrystalline silicon, (also referred to as polysilicon) is being deposited in a process according to the present invention, the activated gas precursor 34 could include hydrogen-bearing gases such as, for example, HCl, $SiH_4$, $SiCl_2H_2$, etc.

One advantage of the present invention is that, unlike conventional CVD processes, the surface temperature of the semiconductor wafers 15 can be lower than is typically required for quality film formation in a conventional CVD process. Where an activated gas 38 is provided in combination with a source gas 30, the surface temperature of the semiconductor wafers 15 can typically be held to about 600° C. or less, more preferably to about 450° C. or less, and even more preferably to about 300° C. or less. As a result, modification or damage of the materials and the structures on the semiconductor wafers 15 can be reduced when the methods and apparatus according to the present invention are used to deposit films on semiconductor wafers 15.

Although only one catalyst 40 and activated gas 38 is discussed in the above description, it will be understood that more than one activated gas could be supplied to the reactor chamber in accordance with the present invention. The additional activated gas or gasses could be activated by contact with the same catalyst as the first activated gas or by one or more different catalysts as desired or needed.

Figure 2:
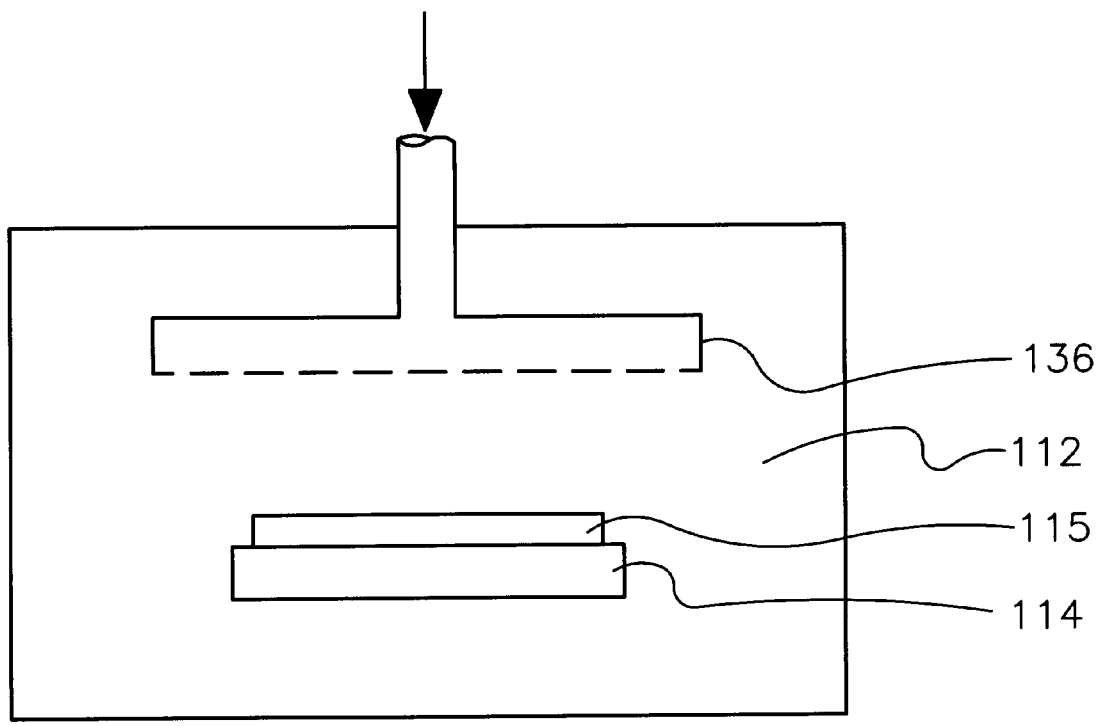
FIG. 2 is a schematic diagram of an alternative apparatus according to the present invention.

FIG. 2 is a schematic diagram of an alternative apparatus according to the present invention in which the reactor chamber 112 includes a "showerhead" gas distributor 136 to distribute an activated gas over the surface of a semiconductor wafer 115 located on a platform 114 below the distributor 136. In this embodiment, the appropriate catalyst will typically be located in the distributor 136 in any suitable location. For example, the catalyst could be used to line the holes in the distributor 136 which would allow for activation of the activated gas precursor immediately before entering the reactor chamber 112. Alternatively, the entire bottom plate of the distributor 136, i.e. the plate in which the distribution holes are located, could be manufactured from the catalyst.

Figure 3:
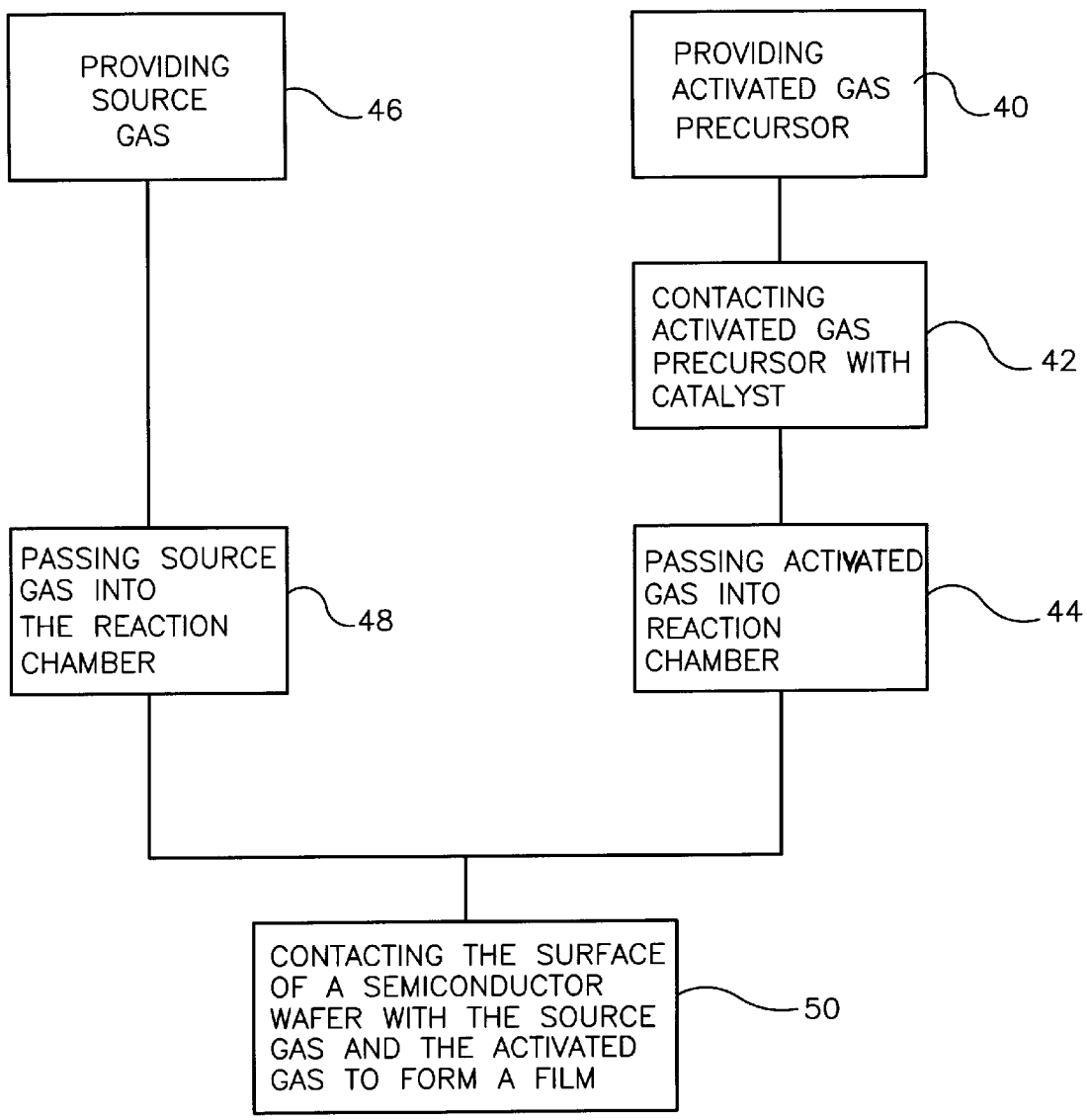
FIG. 3 is a block diagram illustrating one method according to the present invention.

One method according to the present invention is illustrated in the block diagram of FIG. 3. The method includes the steps of providing an activated gas precursor 40, contacting the activated gas precursor with a catalyst to produce the activated gas 42, and passing the activated gas into the reaction chamber 44. The method also includes the steps of providing a source gas 46 and passing the source gas into the reaction chamber 48. The method also includes the step of contacting a semiconductor wafer in the reaction chamber with the source gas and the activated gas to deposit a desired film 50.

One example of such a method comprises depositing a titanium film on the surface of a semiconductor wafer by providing a source gas comprising $TiCl_4$, an activated gas precursor comprising hydrogen ($H_2$), and a catalyst comprising platinum lining the walls of a supply pipe connecting the source of the activated gas precursor to the reaction chamber. The exterior of pipe is preferably heated to a temperature between about 500 and about 600° C. to assist in activating the activated gas precursor. The flow rate of the activated gas precursor is preferably greater than the flow rate of the source gas, more preferably about 2 to about 10 times as great as the source gas flow rate. Pressure within the reaction chamber is preferably held at about 1 mtorr to about 100 torr during deposition. The overall reaction occurs according to the following equation (where [H] is the activated gas species):

$$TiCl_4 + 4[H] \rightarrow Ti + 4HCl \quad \text{(Equation 1)}$$

In another method according to the present invention in which a polysilicon layer is deposited on a semiconductor wafer. The polysilicon is formed using silane ($SiH_4$), which decomposes according to the following overall equation when forming the polysilicon layer:

$$SiH_4 \rightarrow Si + 2H_2 \quad \text{(Equation 2)}$$

Because the silane is an activated species after contact with the catalyst, the typical deposition temperatures used to form polysilicon films using silane may be lower when depositing polysilicon films using silane according to the present invention. It will be understood that using silane to form polysilicon layers can be accomplished using a number of methods. In one method, a single gas source of 100% silane is provided. In another, a combination of silane (e.g., 25%) is provided in a carrier gas (e.g., nitrogen).

In yet another method of using silane to form a polysilicon layer, the silane can be mixed with hydrogen. In this last method, either the hydrogen or the silane can be the activated gas precursor, although it may be helpful to activate the hydrogen to reduce potential gas phase reactions. Furthermore, both the silane and the hydrogen could be activated by contact with a catalyst if desired.

Figure 4:
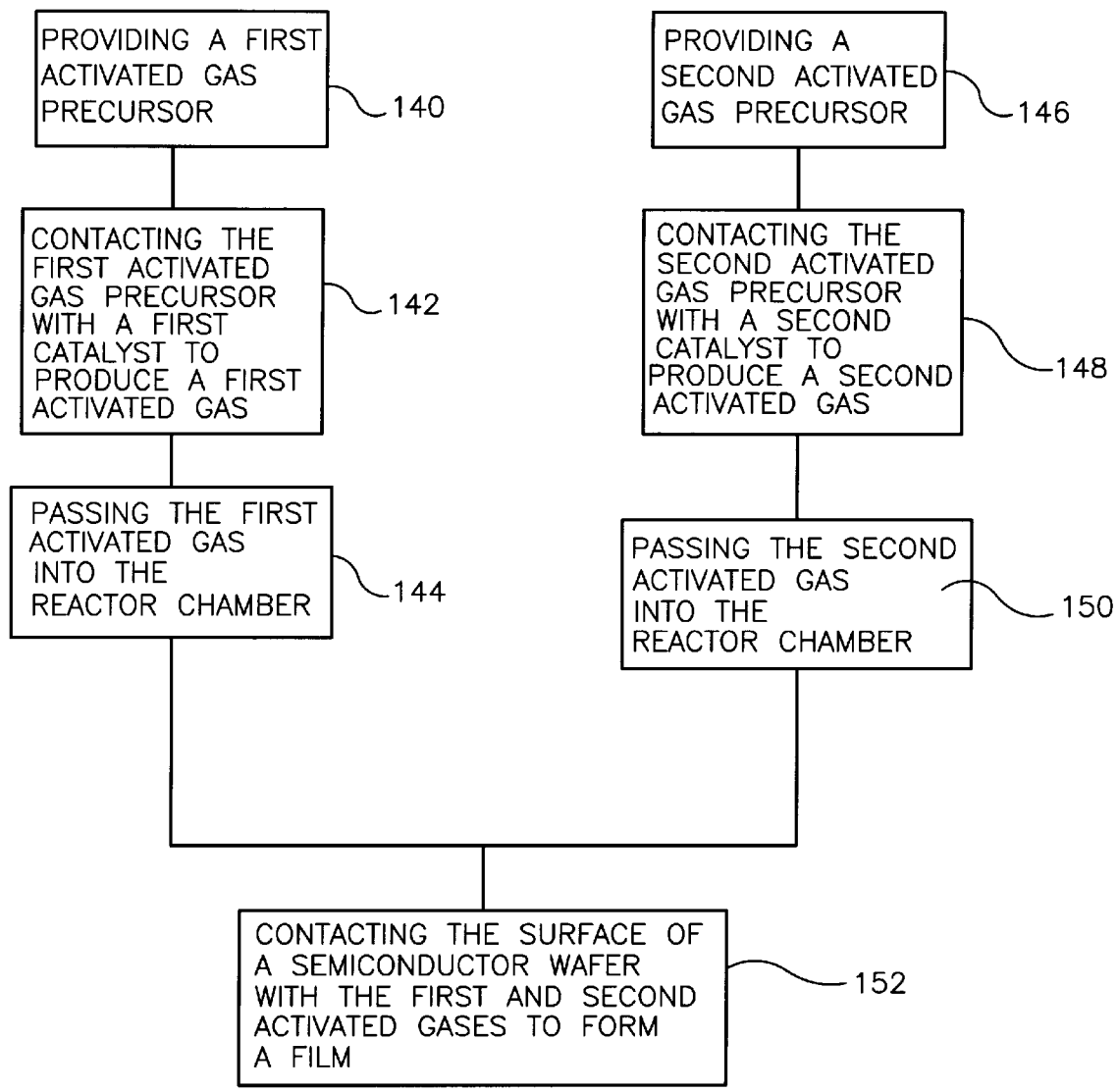
FIG. 4 is a block diagram illustrating an alternative method according to the present invention.

This last method is depicted in FIG. 4, a block diagram of one method of using more than one activated gas in a chemical vapor deposition process according to the present invention. As shown, the method includes the steps of providing a first activated gas precursor 140, contacting the first activated gas precursor with a catalyst to produce the first activated gas 142, and passing the first activated gas into the reactor chamber 144. The method also includes the steps of providing a second activated gas precursor 146, contacting the second activated gas precursor with a catalyst to produce the second activated gas 148, and passing the second activated gas into the reactor chamber 150. The method also includes the step of contacting the surface of a semiconductor wafer with the first and second activated gases 152.

Other films can also be deposited through methods according to the present invention including, for example, doped polysilicon, phosphosilicate glass, boronphosphosilicate glass, $SiO_2$, silicon nitride, silicon oxynitrides, silicon rich oxide films (also referred to as semi-insulating polycrystalline silicon). Adapting these processes to incorporate the method of the present invention will be well within the abilities of one skilled in the art of chemical vapor deposition.

Any patents, patent documents, and publications cited herein are incorporated by reference in their entirety, as if each were individually incorporated by reference. Various modifications and alterations of this invention will become apparent to those skilled in the art without departing from the scope of this invention, and it should be understood that this invention is not to be unduly limited to the illustrative embodiments set forth herein.

What is claimed is:

1. A method of depositing a film on a semiconductor wafer in a chemical vapor deposition process comprising the steps of:

a) providing a semiconductor wafer in a chamber;

b) providing a first gas to the chamber, the first gas passing through a first line, wherein the first gas comprises a refractory metal compound;

c) contacting an activated gas precursor with a catalyst to produce an activated gas;

d) delivering the activated gas into the chamber through a second line, wherein the second line is separate from the first line such that the first gas does not contact the catalyst; and e) contacting the semiconductor wafer with the activated gas and the first gas, wherein a film comprising the refractory metal of the refractory metal compound is formed on the semiconductor.

2. A method according to claim 1, further comprising a step of heating the catalyst to a temperature between about 300° C. to about 1200° C.

3. A method according to claim 1, wherein the activated gas precursor comprises a hydrogen-bearing gas.

4. A method according to claim 1, wherein the activated gas precursor consists essentially of hydrogen.

5. A method according to claim 1, wherein the semiconductor wafer is held at a temperature of about 450° C. or less.

6. A method according to claim 1, wherein the first gas comprises $TiCl_4$ and the activated gas precursor comprises a hydrogen-bearing gas.

7. A method according to claim 1, wherein the catalyst adsorbs at least a portion of the activated gas precursor and desorbs at least a portion of the activated gas.

8. A method of depositing a film on a semiconductor wafer in a chemical vapor deposition process comprising the steps of:

a) providing a semiconductor wafer in a chamber;

b) providing a first gas to the chamber through a first line, wherein the first gas comprises a refractory metal compound;

c) contacting an activated gas precursor with a catalyst located outside of the chamber to produce an activated gas, wherein the catalyst is selected from the group consisting of ruthenium, rhodium, palladium, osmium, iridium, platinum, gold, silver, mercury, rhenium, copper, tungsten, and combinations thereof;

d) delivering the activated gas into the chamber through a second line, wherein the second line is separate from the first line such that the first gas does not contact the catalyst; and e) contacting the semiconductor wafer with the activated gas and the first gas, wherein a film is formed on the semiconductor wafer.

9. A method according to claim 8, wherein the first gas comprises $TiCl_4$ and the activated gas precursor comprises a hydrogen-bearing gas.

10. A method according to claim 9, wherein the semiconductor wafer is held at a temperature of about 600° C. or less.

11. A method according to claim 8, further comprising a step of heating the catalyst to a temperature between about 500° C. to about 600° C.

12. A method of depositing a film on a semiconductor wafer in a chemical vapor deposition process comprising the steps of:
   a) providing a semiconductor wafer in a chamber, the temperature of the semiconductor wafer being held at about 600° C. or less;
   b) providing a first gas to the chamber through a first line, wherein the first gas comprises a refractory metal compound;
   c) contacting an activated gas precursor with a catalyst located outside of the chamber to produce an activated gas;
   d) delivering the activated gas into the chamber through a second line, wherein the second line is separate from the first line such that the first gas does not contact the catalyst; and
   e) contacting the semiconductor wafer with the activated gas and the first gas, wherein a film comprising the refractory metal of the refractory metal compound is formed on the semiconductor.

13. A method according to claim 12, further comprising a step of heating the catalyst to a temperature between about 300° C. to about 1200° C.

14. A method according to claim 12, wherein the activated gas precursor comprises a hydrogen-bearing gas.

15. A method according to claim 12, wherein the activated gas precursor consists essentially of hydrogen.

16. A method according to claim 12, wherein the catalyst adsorbs at least a portion of the activated gas precursor and desorbs at least a portion of the activated gas.

* * * * *